(12) United States Patent
Roux et al.

(10) Patent No.: US 8,928,414 B2
(45) Date of Patent: Jan. 6, 2015

(54) POWER AMPLIFIER WITH LOW NOISE FIGURE AND VOLTAGE VARIABLE GAIN

(75) Inventors: Pascal Roux, Bures-sur-Yvette (FR); Yves Baeyens, Murray Hill, NJ (US); Muriel Gohn, Colombes (FR)

(73) Assignee: Alcatel Lucent, Boulogne-Billancourt (FR)

( * ) Notice: Subject to any disclaimer, the term of this patent is extended or adjusted under 35 U.S.C. 154(b) by 102 days.

(21) Appl. No.: 13/641,789

(22) PCT Filed: Apr. 18, 2011

(86) PCT No.: PCT/EP2011/056139
§ 371 (c)(1),
(2), (4) Date: Dec. 18, 2012

(87) PCT Pub. No.: WO2011/131625
PCT Pub. Date: Oct. 27, 2011

(65) Prior Publication Data
US 2013/0093520 A1    Apr. 18, 2013

(30) Foreign Application Priority Data

Apr. 19, 2010  (FR) ...................... 10 52956

(51) Int. Cl.
*H03F 3/04*  (2006.01)
(52) U.S. Cl.
USPC ............ 330/311; 330/300; 330/260; 330/285
(58) Field of Classification Search
USPC .................................. 330/311, 300, 260, 285
IPC .......................................................... H03F 3/04
See application file for complete search history.

(56) References Cited

U.S. PATENT DOCUMENTS

| | | | | |
|---|---|---|---|---|
| 3,541,234 A | * | 11/1970 | Austin | 348/659 |
| 4,118,731 A | * | 10/1978 | Hinn | 348/809 |
| 4,754,233 A | * | 6/1988 | Pickett | 330/311 |
| 5,742,902 A | | 4/1998 | Shore | |
| 5,838,031 A | | 11/1998 | Kobayashi et al. | |
| 5,920,230 A | * | 7/1999 | Beall | 330/54 |
| 6,046,640 A | * | 4/2000 | Brunner | 330/254 |
| 6,137,363 A | | 10/2000 | Miki et al. | |
| 6,535,065 B2 | * | 3/2003 | Aoki | 330/284 |
| 7,164,318 B2 | * | 1/2007 | Costa et al. | 330/283 |
| 7,323,937 B2 | | 1/2008 | Ooya et al. | |
| 2006/0033575 A1 | | 2/2006 | Ooya et al. | |
| 2007/0007626 A1 | | 1/2007 | Ma et al. | |

FOREIGN PATENT DOCUMENTS

| | | |
|---|---|---|
| EP | 0 794 613 A1 | 9/1997 |
| JP | 09-246877 | 9/1997 |
| JP | 11-074742 | 3/1999 |

(Continued)

OTHER PUBLICATIONS

International Search Report for PCT/EP2011/056139 dated Jun. 27, 2011.

*Primary Examiner* — Patricia Nguyen
(74) *Attorney, Agent, or Firm* — Fay Sharpe LLP

(57) ABSTRACT

The object of the present invention is a low noise figure amplifier with a variable gain which comprises a cascode amplification stage comprising, serially mounted, a low-voltage MOSFET transistor installed as a common source followed by a bipolar transistor with high breakdown voltage installed as a common base. A resistor is placed between the bipolar transistor's collector and the grid of the cascode stage's MOSFET transistor, and the cascode stage is electrically powered through a choke.

7 Claims, 3 Drawing Sheets

(56) References Cited

FOREIGN PATENT DOCUMENTS

| | | |
|---|---|---|
| JP | 2004-022737 | 1/2004 |
| JP | 2004-112299 | 4/2004 |
| JP | 2004-172956 | 6/2004 |
| JP | 2005-311689 | 11/2005 |
| JP | 2005-312016 | 11/2005 |
| JP | 2005 312016 A | 11/2005 |
| WO | WO 03/019774 A1 | 3/2003 |

* cited by examiner

POWER AMPLIFIER WITH LOW NOISE FIGURE AND VOLTAGE VARIABLE GAIN

CROSS-REFERENCE

This application is based on French Patent Application No. 10 52 956 filed on Apr. 19, 2010, the disclosure of which is hereby incorporated by reference thereto in its entirety, and the priority of which is hereby claimed under 35 U.S.C. §119.

TECHNICAL FIELD

The present invention pertains to power amplifier with low noise and voltage variable gain, which may be used on a large band of frequencies (for example from 700 MHz to 2.6 GHz) for base stations of wireless mobile telecommunication infrastructures.

BACKGROUND

In a radiofrequency signal emitting/receiving system, the reception sequence comprises, in a known manner, an antenna receiving the signal that is transmitted to the amplification circuit of a receiver whose function is to filter and amplify the signal that is representative of the transmitted information. The amplifier's main role is to adjust the signal to an appropriate level for the demodulation circuit by reducing the degradation of the signal/noise ratio and the distortion provided by amplifying the useful signal. In receivers for wireless telecommunication infrastructures, there is a major need for highly linear, very-low-noise amplifiers. Furthermore, these amplifiers must be capable of adapting to the requirements of different receiver manufacturers, as these receivers do not always require the same performance compromises. Additionally, various terrain configurations make easily adjustable performances a necessity in order to address the majority of cases. For example, signal losses within the cable that connects the antenna placed at the top of the mast or pylon to the receiver placed in a housing within the base station depend on the length of that cable. For another example, the filter's characteristics may differ from one manufacturer to another.

The receiver must have a low noise figure (or "NF") and an adjustable power gain in order to adjust the signal's level at the input of the demodulator and to guarantee the broadest possible range of gain variation as appropriate for the terrain configuration. To that end, a low-NF, variable-gain amplifier is inserted into the reception sequence right after the antenna, cable, and filter. The noise from the amplifier must be low enough to add little noise to the reception chain, and the amplifier must exhibit a linearity and output power which are sufficient to enable the simultaneous amplification of high-level and low-level amplitude signals without distortion, throughout the entire range of the variation being considered. Furthermore, among some manufacturers, the option to adjust the amplifier's gain makes it possible to offset temperature variations within the reception sequence in order to maintain a roughly constant gain value.

One currently known solution that is particularly used in television tuners is made up of a linearly variable attenuator, followed by a variable-gain amplification stage placed after a low-noise, fixed-gain amplifier and a mixer. This solution, using MOSFET (Metal-Oxide Semiconductor Field Effect Transistor) technology, makes it possible to have a constant output gain level while limiting the noise figure's degradation. This is appropriate to the application for receiving television signals. However, the performances achievable through this sort of solution are not appropriate to the needs in the field of mobile telecommunication infrastructures.

Today, the performances of a low-noise, variable-gain amplifier for a base station, in the range around 900 MHz for example, normally have a noise figure of less than 1 dB, a gain of about 30 dB, and an intermodulation product of about 3 at its input above 0 dBm across the entire temperature range, and for a gain variation range of about 15-20 dB.

SUMMARY

It is therefore sought to obtain a low-noise, variable-gain, high-linearity amplifier that can be integrated and that can be mass-produced at a low cost in a silicon-based microelectronics technology, in order to reduce the cost of base station receivers. The topology must be adaptable in order to cover the needs of higher-frequency applications such as radio frequencies.

It is also sought to achieve a variation in power gain through very low-amplitude steps (for example less than 0.1 dB) in order to achieve a more accurate gain value that is as close as possible to the desired gain value across the entire variation range of the gain, within the entire frequency band and for all temperatures.

The object of the present invention is an integrated low-noise-figure, variable-gain amplifier comprising a cascade amplification stage which comprises, connected serially, a low-voltage MOFSET transistor installed as a common source, followed by a bipolar high breakdown voltage transistor, with at least twice the voltage of the MOFSET transistor, installed as a common base. A resistor is placed between the bipolar transistor's collector and the grid of the cascade stage's MOSFET transistor, and the cascode stage is electrically powered through a choke.

An integrated amplifier is an amplifier that may be constructed using a microelectronic semiconductor technology that makes it possible to integrate the majority of active and passive components needed to achieve the function.

The cascade (a contraction of "cascade to cathode") stage operates like an amplification stage whose gain may vary continuously by several decibels. It is intended to ensure linearity and enable the smallest possible gain variations intervals, without degrading the noise figure. Increasing the linearity and power involves increasing the voltage and current deviation. The combined use of a low-voltage MOSFET transistor, approximately 3 V, about 3 V-3.3 V for example, and a bipolar high-breakdown voltage transistor leads to a very good amplifier linearity. This combination is achieved in a technology known as BiCMOS (Bipolar Complementary Metal-Oxide Semiconductor). The common-source MOSFET transistor makes it possible to improve the amplifier's linearity, and a high breakdown voltage of the bipolar transistor (at least twice the voltage of the MOSFET transistor) increases the voltage deviation at the output of the cascade stage, and therefore makes it possible to improve the amplifier's linearity. The frequency performances are slightly degraded by the use of a common-base bipolar transistor with a high breakdown voltage, which makes it possible to reduce the size of the transistors used.

In a first embodiment, the amplifier may further comprise at least one switchable attenuator at the output of the cascade stage. In order to achieve the desired range of gain variation (on the order of 15-20 dB), one or more highly-linear, low-loss switchable attenuators may be added to the output of the cascade stage. This switchable attenuator introduces losses and does little to increase the noise value if the amplifier's gain is sufficient. On the other hand, this attenuator's linearity must be high in order to maintain the linearity of the entire receiver. Furthermore, this switchable attenuator exhibits a constant impedance at the output of the cascode stage, regardless of the attenuation level.

In a second embodiment, the amplifier may further comprise at least one switchable attenuator at the input of the cascode stage. The linearity may thereby be improved at lower gain settings to the detriment of the noise figure, owing to the addition of an input attenuator whose topology is similar to that of the switchable attenuator that may be placed at the output of the cascode stage. This switchable attenuator at the input makes it possible to extend the use of the circuit to all terrain configurations, or to receive radio signals that may be of very high levels.

In a third embodiment, the supply voltage required at the input of the command circuit of the switchable attenuator, which is connected to the MOSFET transistor's grid, is of the same order of magnitude as the supply voltage of the cascode stage, a voltage less than the supply voltage of the cascode stage being required at the source and drain of the switchable attenuator's MOSFET transistor.

In a fourth embodiment, the amplifier may further comprise a resistor placed between the bipolar transistor's collector and the grid of the cascode stage's MOSFET transistor. This resistor's function is to improve the linearity and bandwidth, and to reduce the impedance variations at the input and output of the cascode stage in the event of base voltage variations of the bipolar transistor.

In a fifth embodiment, the amplifier may further comprise an interface circuit for controlling the base voltage of the bipolar transistor as a function of the gain to be achieved. The interface circuit is intended to control the base voltage of the cascode stage's common-base bipolar transistor, without causing substantial degradation in the noise. The command of the first gain decibels is an analog command that operates by varying the base voltage of the cascode stage's common-base bipolar transistor. The base voltage that is applied is preferentially limited by the interface circuit regulating the voltage, in order to maintain a low noise value and the input linearity of the cascode stage.

In a sixth embodiment, the interface circuit may further comprise a resistor associated with a capacitor in order to filter the outside noise transmitted to the amplifier, generated elsewhere and transmitted via the cascode stage's supply circuit.

In a seventh embodiment, the amplifier may further comprise at least one digital-to-analog converter for digitally controlling the amplifier. The interface circuit is driven by an 8-bit digital-to-analog converter (or "DAC") which makes it possible to control the gain by a digital input. The cascade stage and interface circuit make it possible to achieve the specifications with a range in gain variation of about 2 dB.

Thus, an integrated amplifier with low noise and variable gain is achieved, which may be large-band; it is designed to cover most Telecom standards from 700 MHz to more than 2.6 GHz, but it is not limited to this frequency range, and may cover other radio applications.

Another advantage of the invention is particularly the reduction in the number of discrete electronic components in the receiver, by integrating low-noise amplification, gain-control, and attenuation functions into a single circuit. The surface area taken up by a receiver application board is thereby reduced by a factor of more than 5. The in-plant gain adjustment is facilitated thanks to the addition of a digital input control circuit and a digital-to-analog converter within the amplifier. A digital gain command means is obtained over the entire range of variation, with an accuracy better than 0.1 dB.

BRIEF DESCRIPTION OF THE DRAWINGS

Other characteristics and advantages of the present invention will become apparent upon reading the following description of one embodiment, which is naturally given by way of a non-limiting example, and in the attached drawing, in which.

DETAILED DESCRIPTION

Figure 1:
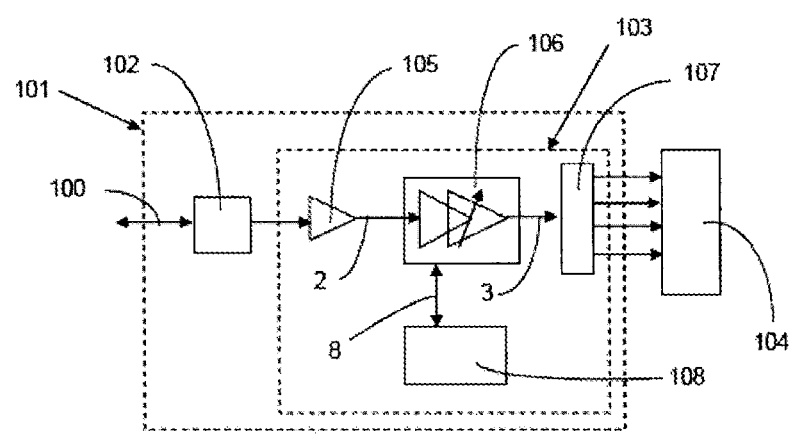
FIG. 1 is a schematic view of one particular embodiment of a base station's reception sequence.

FIG. 1 shows a base station's reception sequence. An antenna receives an RF signal 100 to amplify. The cable connecting the antenna to the front emitter/receiver 101 transmits the signal 100 to a duplexer filter 102 which makes it possible to conduct a first filtering of the useful signals while heavily attenuating the signals outside of the range of frequency reception. The filtered signal 100 enters a receiver 103 that makes it possible to adapt the filtered signal 100 coming from the duplexer filter 102 before sending it to a demodulation circuit 104, which comprises a mixer and a demodulator. The receiver 103 comprises a first very-low-noise, fixed-gain amplifier 105 (called "LNA" for "Low Noise Amplifier"), followed by a second very-low-noise, variable-gain amplifier 106 (called "VGA" for "Variable Gain Amplifier"), then by a power distributor 107. The power distributor 107 makes it possible to distribute the RF signal 100 amplified within the demodulation circuit 104. A digital processor 108 makes it possible, in particular, to command the second amplifier 106.

The second VGA amplifier 106, with very-low-noise and variable-gain, is designed to have a constant input linearity across the entire range of gain variation. The gain of the first LNA amplifier 105, or head amplifier, is about 20 dB in order to guarantee a low noise figure within the reception sequence when the gain is minimal. Based on a range of gain variation on the order of 20 dB and on the noise figure of the fixed-gain head amplifier 105, the desired performances are determined for the second variable-gain amplifier 106. In this situation, the second VGA amplifier 106, with very-low-noise and variable-gain, has a gain of about 12 dB, a maximum noise figure of 5 dB, and an intermodulation product of about 3 at the input, which is greater than 25 dBm for an adjustment range of about 15-20 dB. First, increasing the gain of the first LNA amplifier 105 would require reducing the gain and increasing the consumption of the second amplifier 106 in order to maintain linearity. Second, reducing the gain of the first LNA amplifier 105 would make the noise figure of the second variable-gain VGA amplifier 106 very difficult to guarantee across the entire range of gain variation. There is a need for great accuracy in the gain variation interval (less than 0.1 dB, for example, or even less than 0.5 dB) in order to achieve a gain value of the receiver 103 that is as accurate and close as possible to the desired gain value.

Figure 2:
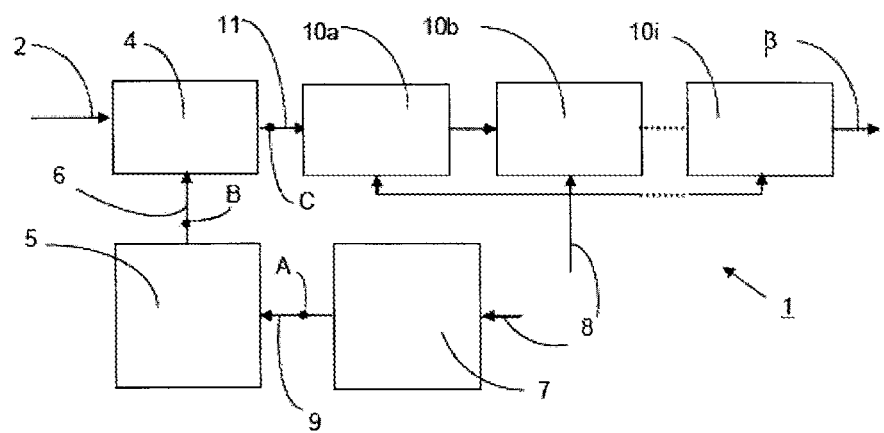
FIG. 2 is a schematic diagram of one embodiment of an integrated amplifier with a low noise figure and variable gain.

FIG. 2 shows the diagram of one particular embodiment of BiCMOS technology of a low-noise-figure, variable-gain, power amplifier 1 (good linearity). A power amplifier is an amplifier having output characteristics in terms of linearity and power such that the third-order intermodulation product is greater than 1 watt and the output power is much greater than 0.1 Watts (20 dBm). The amplifier 1 comprises, between an input 2 and an output 3, a cascode amplification stage 4.

According to a first embodiment, the amplifier 1 may further comprise an interface circuit 5 connected to the cascode stage 4, by a link 6 comprising a point B, for controlling the base voltage of the cascode stage 4.

In a second embodiment, the amplifier 1 may further comprise a digital-to-analog converter 7 receiving digital data 8. The converter 7 transforms this digital data 8 into an analog voltage that is transmitted to the interface circuit 5, by the link 9 comprising a point A. The interface circuit 5 adapts this voltage to obtain the voltage desired on the cascode stage 4, thereby making it possible to achieve a gain variation in small intervals, such as 0.1 dB or less.

In a third embodiment, the amplifier 1 may further comprise one or more switchable attenuators 10a, 10b, ... 10i added to the output of the cascode stage 4 in order to increase the range of gain variation without degrading the noise and linearity of the amplifier. A link 11 comprising a point C connects the switchable attenuators 10a, 10b, ... 10i to the cascode stage 4 from which they receive a digital signal. It is easy to add as many switchable attenuators 10a, 10b, ... 10i as desired in order to achieve the specifications for the range of gain variation.

Figure 3:
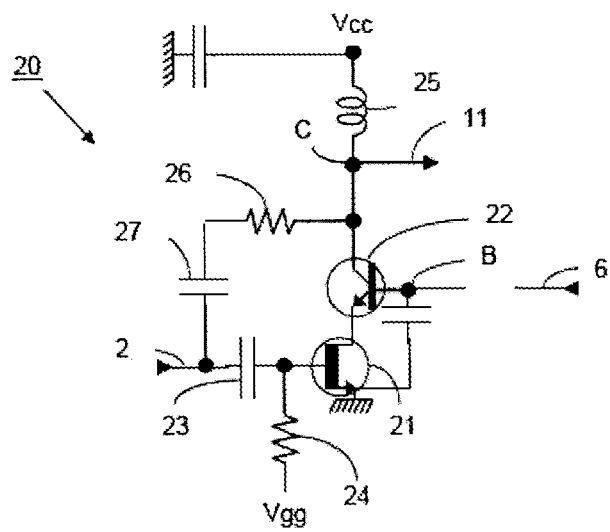
FIG. 3 is a schematic view of one particular embodiment of a cascode stage.

A cascode stage 20 is depicted in detail in FIG. 3. The cascode stage 20 is built with a MOSFET transistor 21 installed as a common source, followed by a bipolar transistor 22 with a high breakdown voltage (about 6 to 7 Volts for example) installed as a common base, these two transistors 21, 22 being serially connected in order to optimize the linearity and input/output insulation of the cascade amplification stage 20. It is possible to choose a bipolar transistor 22 with a breakdown voltage that is greater or lower depending on the desired performance and the available supply voltage. The breakdown voltage of the bipolar transistor 22 preferably has a value that is at least twice the value of the voltage of the MOSFET transistor 21. The use of a "cascode" installation makes it possible to improve the linearity of the cascode stage 20 by using transistors 21, 22 of a large size and high currents without significantly degrading the radio performances. A capacitor 23 is placed between the MOSFET transistor 21 and the input 2 of the amplifier.

The grid voltage $V_{gg}$ of the MOSFET transistor 21 defines the electrical current passing through the cascode stage 20. The electrical current is polarized through a high-value resistor 24 so as not to degrade the noise figure of the cascode stage 20. The cascode stage 20 is electrically powered with a voltage $V_{cc}$ on the order of 6 V through a choke 25 in order to ensure decoupling between the direct current and the RF signal while limiting the fall in potential at the terminals of the choke 25. This enables the greatest possible voltage deviation at the output of the cascode stage 20 for a given supply voltage. The use of a cascode stage 20 that includes a bipolar transistor 22 with a high breakdown voltage makes it possible to increase the polarization voltage, and therefore to increase the voltage deviation at the output of the cascode stage 20.

A feedback resistor 26 makes it possible to increase the bandwidth, to make the gain curve flatter, and to improve the linearity of the cascode stage 20 for a given gain variation and a given voltage deviation B. The feedback resistor 26 also makes it possible to accurately define the stage's maximum gain and improve stability. The feedback resistor 26 also makes it possible to minimize the variation in impedance at the input of the cascode stage 20 whenever the gain is modified by changing the voltage applied at point B. The capacitor 23, and a capacitor 27 mounted serially with the resistor 26, make it possible to decouple the continuous voltage.

Whenever the voltage at point B varies, the drain-source voltage of the MOSFET transistor 21 changes, which changes the amplifier's gain. Within a certain range of voltage at the given point B, the noise figure and the linearity at the input are little affected by the variation in the gain. This range of voltage is used to obtain a gain variation on the order of 2 dB. As the base-collector voltage of the bipolar transistor 22 increases very slightly when the voltage at point B decreases, a slight increase in the linearity of the cascode stage 20 without a significant degradation in noise may be observed.

Figure 4:
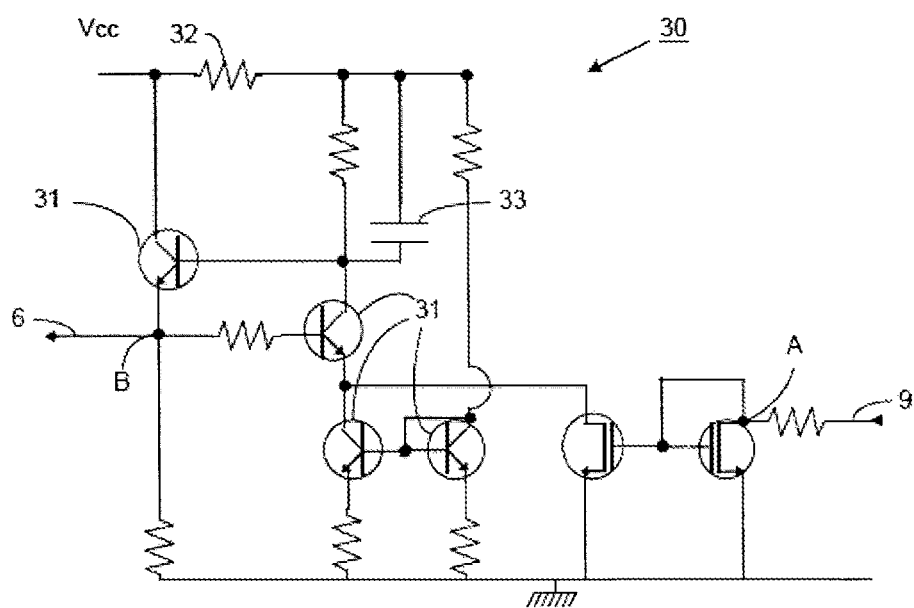
FIG. 4 is a schematic view of one embodiment of an interface circuit for controlling the base voltage.

An interface circuit 30, depicted in FIG. 4, makes it possible to control this gain without degrading the noise figure, and to assure the interface between the input (point B) of the cascode amplification stage and the output of the digital-to-analog converter (point A). The noise figure and linearity are maintained for a gain variation of about 2 dB. Bipolar transistors 31 make it possible to maintain constant polarization on the cascode stage across the entire service temperature range. A resister 32 combined with a capacitor 33 has the function of filtering the noise that comes from the electrical supply. Without this filtering, a major degradation in the noise figure related to the frequency of service and to the decoupling of the variable-gain VGA amplifier is observed.

Figure 5:
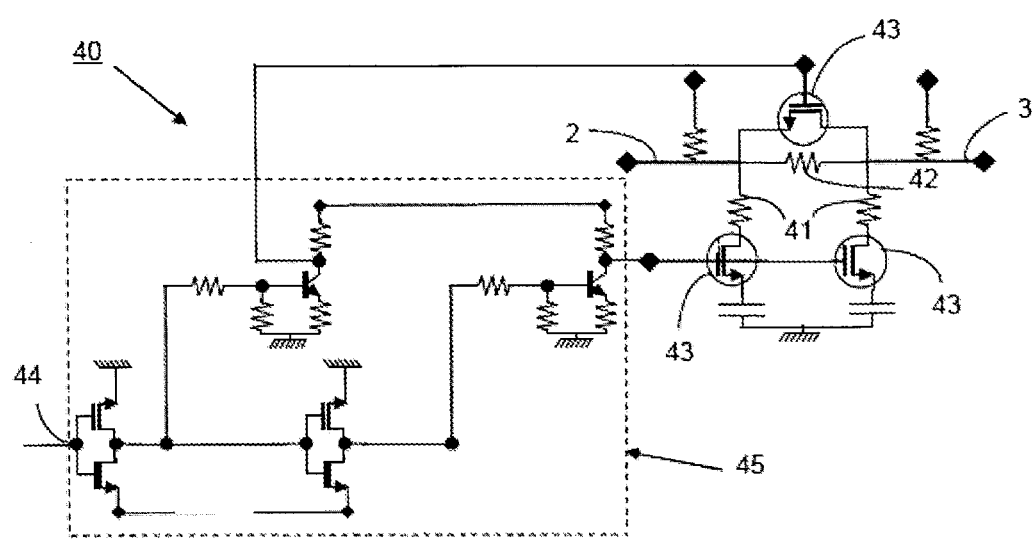
FIG. 5 is a schematic view of one embodiment of a switchable attenuator.

A switchable attenuator 40, controlled by 1-bit with a continuous level shifter, is depicted in FIG. 5. The switchable attenuator 40 may be added to the output or input of the cascode stage in order to improve the amplifier's linearity when the gain decreases. The switchable attenuator 40 comprises an absorptive attenuator, a "pi-type" attenuator in this case, made up of resistors 41, 42 that can be placed in a short-circuit or open circuit by MOSFET transistors 43. The absorptive attenuator 41, 42 could also be replaced by a different type of attenuator.

The switchable attenuators 40 were constructed with a MOSFET transistor 43 (3.3 Volt) whose drain and source are polarized at a voltage slightly less than the maximum voltage of the MOSFET transistor 43 (in the present situation 3 V for a maximum voltage of 3.3 V) in order to improve the linearity and output voltage deviation. In order to increase linearity, it may be necessary to modify the drain-source voltages of the MOSFET transistors 43.

Furthermore, the grid-source voltage of the MOSFET transistors 43 is shifted in order to to achieve a grid-source voltage of −1 Volt (MOSFET OFF) and 3 Volt (MOSFET ON) in order to mainly improve the switchable attenuator's insertion losses 40. The output digital attenuators' losses may be reduced, and their linearity increased, by using a supply voltage (6 V), imposed at the input 44 of the control circuit 45 of the switchable attenuator 40, whose value is the same as the supply voltage Vcc of the cascode stage. The sizes of the MOSFET transistors 43 are different depending on whether the MOSFET transistors 43 are connected in parallel with the resistor 41 or serially with the resistors 42. The sizes of the MOSFET transistors 43 are determined in order to achieve the best compromise between the minimum insertion losses in the on-state, the operating frequency, and the desired linearity.

The attenuator 40 may be switched between an on-state (minimum insertion loss=x in dB) and an off-state (maximum insertion losses=y in dB). The difference in attenuation between the two states make it possible to define an off-state z such that z=(y−x) in dB. The minimum insertion losses x are mainly due to the equivalent resistance $R_{on}$ of the MOSFET transistors 44 in the on-state, and the equivalent capacitance $C_{off}$ of the MOSFET transistors 44 in the off-state, as well as the various parasitic elements and losses due to mismatch. When constructing the amplifier out of silicon-based microelectronics technology, the minimum insertion losses x at 1 GHz were about 0.25 dB. The maximum insertion losses y in the on state are linked to the resistors 41, the parasitic elements, and the mismatch. A limited number of attenuators is used to cover $2^n \times z$ with n given by the lowest attenuation interval value z. In order to guarantee that the desired gain and accuracy can be obtained, an attenuation interval value z is chosen which is less than the range of gain variation that was defined for the cascode stage.

Furthermore, it is difficult to create very low-attenuation (<0.5 dB) and accurate intervals because the $R_{on}$ (resistance equivalent to a transistor in the on-state) of the MOSFET transistors 43 is of the same order of magnitude as the serial resistors 42 of the absorptive attenuator. It is therefore desirable to use the cascode stage in order to vary the gain if attenuation steps less than 0.5 dB are desired. The input impedance of the attenuators 40 is constant and equal to the power output impedance of the cascode stage, this output impedance being chosen such that the power of the signal is as high as possible at the output of the cascode stage.

Naturally, the present invention is not limited to the described embodiments, but rather is subject to many variants accessible to the person skilled in the art without departing from the spirit of the invention.

The invention claimed is:

1. An integrated power amplifier with low noise figure and variable gain, comprising a cascode amplification stage which comprises, connected serially, a low-voltage MOSFET transistor installed as a common source, followed by a bipolar transistor with a high breakdown voltage, at least twice the voltage of the MOSFET transistor, installed as a common base, a feedback resistor being placed between the bipolar transistor's collector and the grid of the cascode stage's MOSFET transistor, and the cascode stage being electrically powered through a choke connected to the collector of the bipolar transistor.

2. An amplifier according to claim 1, further comprising an interface circuit for controlling the base voltage of the bipolar transistor as a function of the gain to be obtained.

3. An amplifier according to claim 2, wherein the interface circuit may further comprise a resistor combined with a capacitor, in order to filter the outside noise transmitted to the amplifier.

4. An amplifier according to claim 1, further comprising at least one digital-to-analog converter for digitally controlling the amplifier.

5. An amplifier according to claim 1, further comprising at least one switchable attenuator at the output of the cascode stage.

6. An amplifier according to claim 1, further comprising at least one switchable attenuator at the input of the cascode stage.

7. An amplifier according to claim 5, wherein the supply voltage imposed at the input of the switchable attenuator's command circuit is of the same order of magnitude as the supply voltage of the cascode stage, a voltage less than the supply voltage of the cascode stage being imposed at the source and drain of the switchable attenuator's MOSFET transistor.

* * * * *